(12) United States Patent
Fukaya et al.

(10) Patent No.: US 9,851,633 B2
(45) Date of Patent: Dec. 26, 2017

(54) INORGANIC MATERIAL FILM, PHOTOMASK BLANK, AND METHOD FOR MANUFACTURING PHOTOMASK

(71) Applicant: Shin-Etsu Chemical Co., Ltd., Tokyo (JP)

(72) Inventors: Souichi Fukaya, Niigata (JP); Kouhei Sasamoto, Niigata (JP); Hideo Nakagawa, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/190,583

(22) Filed: Jun. 23, 2016

(65) Prior Publication Data

US 2017/0003584 A1   Jan. 5, 2017

(30) Foreign Application Priority Data

Jul. 1, 2015   (JP) ................. 2015-132786

(51) Int. Cl.
*G03F 1/50* (2012.01)
*G03F 1/54* (2012.01)
*G03F 1/80* (2012.01)

(52) U.S. Cl.
CPC ............... *G03F 1/50* (2013.01); *G03F 1/54* (2013.01); *G03F 1/80* (2013.01)

(58) Field of Classification Search
CPC .............. G03F 1/50; G03F 1/54; G03F 1/80
USPC .................................................. 430/5
See application file for complete search history.

(56) References Cited

U.S. PATENT DOCUMENTS

| | | |
|---|---|---|
| 5,474,864 A | 12/1995 | Isao et al. |
| 5,750,290 A | 5/1998 | Yasuzato et al. |
| 8,968,972 B2 * | 3/2015 | Yoshikawa ............. C22C 27/06 428/433 |
| 9,488,907 B2 * | 11/2016 | Yoshikawa ............. C22C 27/06 |
| 2007/0212618 A1 | 9/2007 | Yoshikawa et al. |
| 2007/0212619 A1 | 9/2007 | Yoshikawa et al. |
| 2013/0309598 A1 | 11/2013 | Fukaya et al. |

FOREIGN PATENT DOCUMENTS

| | | |
|---|---|---|
| EP | 1 847 874 A2 | 10/2007 |
| EP | 2 645 166 A1 | 10/2013 |
| JP | 7-140635 | 6/1995 |
| JP | 8-292549 | 11/1996 |
| JP | 2001-230197 A | 8/2001 |
| JP | 2007-33470 | 2/2007 |
| JP | 2007-241060 | 9/2007 |
| JP | 2007-241065 | 9/2007 |
| JP | 2013-238776 | 11/2013 |
| WO | WO 2007/074806 A1 | 7/2007 |

OTHER PUBLICATIONS

Extended European Search Report dated Jan. 11, 2017 in Patent Application No. 16176476.6.

* cited by examiner

*Primary Examiner* — Christopher Young
(74) *Attorney, Agent, or Firm* — Oblon, McClelland, Maier & Neustadt, L.L.P.

(57) ABSTRACT

An inorganic material film containing tin within the concentration range of 0.1 atomic percent or higher but no higher than 11.5 atomic percent eliminates the problem in which tin localizes and forms into particles, with the result that these particles turn into defects in an optical film. An inorganic material film for a photomask blank according to the present invention film-formed by sputtering and composed of a chromium-containing material includes a light-shielding layer having electrical conductivity, wherein the light-shielding layer contains 0.1 atomic percent or higher but no higher than 11.5 atomic percent of tin and no higher than 15 atomic percent of oxygen. The lower limit of oxygen concentration is, for example, 3 atomic percent. The inorganic material film has electrical conductivity, which is preferably no higher than 5000 $\Omega/cm^2$ when evaluated in terms of resistance values.

9 Claims, 5 Drawing Sheets

INORGANIC MATERIAL FILM, PHOTOMASK BLANK, AND METHOD FOR MANUFACTURING PHOTOMASK

BACKGROUND OF THE INVENTION

Field of the Invention

The present invention relates to an inorganic material film which is a component of a photomask blank used to fabricate photomasks used in the microfabrication of semiconductor integrated circuits, CCDs (charge-coupled devices), color filters for LCDs (liquid crystal display devices), magnetic heads and the like.

Description of the Related Art

In the field of semiconductor technology, among others, a microfabrication technique is an extremely important basic technology, and therefore, research and development has been conducted for the purpose of further refinement. In recent years, particularly, due to high integration of a large scale integration circuit, refinement of circuit patterns, wiring patterns, or contact-hole patterns for wiring between layers forming a cell, a request for microfabrication technology has been increased.

In the context of the above-described circumstances, even in the field of technology for photomask production to be used in the process for photolithography at the time of microfabrication, a technique for making it possible to draw fine and correct circuit patterns (mask patterns) has begun to be demanded.

In order to form more precise mask patterns, a high-precision resist pattern needs to be formed on a photomask blank. Generally, reduction projection is performed when forming a pattern on a semiconductor substrate by photolithographic technique. Accordingly, the size of the pattern formed on a photomask is approximately four times the size of the pattern formed on the semiconductor substrate. This does not necessarily mean that accuracy is relaxed, but high accuracy is still required.

In today's photolithography technical field, the size of a circuit pattern to be drawn is considerably smaller than the wavelength of light to be used for exposure. Thus, in the case of forming a photomask pattern with a just four-times larger circuit pattern, light interference or the like, which is generated under exposure, influences on transfer of an original shape. As a result, the original shape cannot be transferred onto the resist film of a photomask blank.

Hence, the photomask pattern may in some cases be processed into a shape more complicated than an actual circuit pattern, in order to relieve such an effect. The shape may be, for example, a shape subjected to optical proximity correction (OPC).

In general, when forming a photomask pattern, a resist film is formed on the surface of the photomask blank in which a light-shielding film is deposited on a transparent substrate, and a pattern is then drawn (exposed) on the resist film by an electron beam. Subsequently, after obtaining a resist pattern after developing the exposed resist film, the light-shielding film is etched by using this resist pattern as a mask to obtain a light-shielding (film) pattern. The light-shielding (film) pattern thus obtained is served as a photomask pattern.

In this case, the above resist film should be thinned depending on the degree of fineness of the light-shielding pattern. This is because, when forming a fine light-shielding pattern while keeping the thickness of the resist film, the ratio (aspect ratio) of the thickness of the resist film to the size of the light-shielding pattern becomes large and causes troubles of failed pattern transfer, falling down or peeling off of the resist pattern, or the like due to deterioration of the shape of the resist pattern.

As a material of the light-shielding film deposited on the transparent substrate, many kinds of materials have so far been proposed. Among them, however, a chromium compound has been practically used because of much know-how on etching, for example.

Dry etching of a chromium film is generally performed by chlorine-containing dry etching. In many cases, however, chlorine-containing dry etching has a certain level of ability to etch an organic layer. Accordingly, if the resist pattern is formed on a thin resist film when the light-shielding film is etched, this resist pattern undergoes a measurable degree of etching due to chlorine-containing dry etching. This adverse effect will result in a failure to precisely transfer an originally-intended resist pattern onto the light-shielding film.

A resist material having excellent etching resistance has been requested. However, the reality is that such a resist material has not been known yet. For such reasons, restudies are being made of light-shielding film materials having higher processing accuracy, in order to obtain high-resolution light-shielding (film) patterns.

An effort to improve the etching rate of a light-shielding film by allowing a chromium compound which is a light-shielding film material to contain only a predetermined amount of light element has been reported as a specific example of approach to the restudies of light-shielding film materials having higher processing accuracy (WO 2007/74806 A, JP 2007-33470 A, and the like).

WO 2007/74806 A discloses a technique for reducing resist film loss by using a material mainly containing chromium (Cr) and nitrogen (N) and having an X-diffraction peak of substantially CrON(200) to enhance a dry-etching rate of the light-shielding film.

In addition, JP 2007-33470 A discloses the invention of a photomask blank where the composition, film thickness, and stacked structure thereof are suitably designed to obtain desired transmittance T and reflectance R while attaining an increase in the rate of dry-etching by providing the light element with rich content of a light element and low content of chromium.

However, the technique as described above, where a light element is added to a chromium-containing compound to suppress a decrease in thickness of a resist film by increasing the dry-etching rate of a light-shielding film, has the following disadvantage:

When using a chromium-based compound as a light-shielding film material, the light-shielding film should not only ensure its improved etching rate but also ensure predetermined optical containing characteristics because the light-shielding film also serves as an optical film. However, the flexibility of the film design enough to simultaneously satisfy both demands is not always high.

Even if the chromium-containing compound is used as a film material for forming a hard mask to be used to process the light-shielding film rather than as a material for the light-shielding film, the range of amounts of light element that can be added to secure the functionality of the compound is limited naturally. The flexibility of film design is therefore not necessarily high, either.

For such reasons as described above, there is the desire for the provision of techniques to improve the etching rate of films composed of a chromium-containing compound by a procedure different from conventional procedures, such light element addition.

As one of the techniques, JP 2013-238776 A discloses allowing a chromium-containing compound to contain tin to improve the etching rate of a film.

It has become clear, however, that tin particle agglomeration may take place in such a tin-containing chromium-containing compound to such a degree as is discriminable at a surface roughness level. If this compound is formed into a hard mask film and dry etching based on oxygen-containing chlorine is performed to draw a fine pattern, etching progresses locally in such locations where tin particles are agglomerated. This can be a cause for defects or the degradation of pattern fidelity and is, therefore, undesirable.

SUMMARY OF THE INVENTION

In order to solve the above-described problem, an inorganic material film for a photomask blank according to the present invention formed by sputtering and composed of a chromium-containing material includes a light-shielding layer having electrical conductivity, wherein the light-shielding layer contains 0.1 atomic percent or higher but no higher than 11.5 atomic percent of tin and no higher than 15 atomic percent of oxygen.

In one illustrative embodiment, the inorganic material film includes an anti-reflection layer film-formed by sputtering and composed of a chromium-containing material.

In another illustrative embodiment, the anti-reflection layer contains tin.

For example, the inorganic material film has a stacked structure composed of the light-shielding layer and the anti-reflection layer.

Preferably, the arithmetic average roughness (Ra) of the inorganic material film is 1.0 nm or lower.

Also preferably, the resistance value of the inorganic material film is 5000 $\Omega/cm^2$ or smaller.

For example, an oxygen concentration in the light-shielding layer is 3 atomic percent or higher.

For example, the chromium-containing material is one of chromium metal, chromium oxide, chromium nitride, chromium carbide, chromium oxide nitride, chromium oxide carbide, and chromium oxide nitride carbide.

The photomask blank according to the present invention is provided with the above-described inorganic material film as one of a light-shielding film, a hard mask film, and an etching stopper film.

In addition, a method for manufacturing a photomask according to the present invention includes a step of patterning the inorganic material film by chlorine-containing dry etching using the above-described photomask blank.

In the present invention, the amount of tin content is set to a proper range in an inorganic material film including a light-shielding layer having electrical conductivity, so that tin does not localize in the light-shielding layer. Consequently, when the inorganic material film according to the present invention is used as a light-shielding film, a hard mask film, an etching stopper film, or the like, it is possible to improve a dry-etching rate, while concurrently securing characteristics equivalent to those of a conventional chromium-containing material film. It is also possible to prevent defect generation due to the localization of tin.

DETAILED DESCRIPTION OF THE PREFERRED EMBODIMENTS

Hereinafter, an inorganic material film according to the present invention will be described with reference to the accompanying drawings.

As described earlier, a procedure for decreasing the reduction of a resist film during an etching process by increasing the dry-etching rate of a light-shielding film by the addition of a light element to a chromium-containing compound conventionally has the disadvantage in which, for example, the flexibility of film design for simultaneously satisfying both the improvement of an etching rate and the securement of predetermined optical characteristics is not necessarily high. There has therefore been the desire for the provision of techniques to improve the etching rate of films composed of a chromium-containing compound by a procedure different from conventional procedures, such light element addition.

In the context of such circumstances, the present inventors have conducted a great deal of study and found out that the rate of dry etching based on oxygen-containing chlorine can be significantly improved without causing a great change in optical characteristics and etching resistance to fluorine-containing dry etching by allowing a chromium-containing material, which has conventionally been used as a light-shielding film material, to contain tin.

As the result of a further study, however, the present inventors have found that tin localizes and forms into particles several tens to several hundred nanometers in size, if film formation is performed in an atmosphere containing a fewer amount of reactive gas, such as oxygen or nitrogen, when the chromium-containing material is allowed to contain tin.

In the present invention, the amount of tin content is set to a proper range in an inorganic material film including a light-shielding layer having electrical conductivity, so that tin does not localize in the light-shielding layer.

Since a chromium-containing material has comparatively good chemical stability, it has been widely used as an optical film material. In addition, the chromium-containing material is highly resistant to fluorine-containing etching gases. Accordingly, the chromium-containing material can be safely used also as a mask when a silicon-containing material film is patterned in a case where fluorine-containing dry etching is performed on a silicon-containing material.

The chromium-containing material film is generally patterned by chlorine-containing dry etching, however, as described above. A resist used for patterning therefore undergoes a non-negligible degree of etching due to the chlorine-containing dry etching. Thus, it is difficult to pattern the chromium-containing material film with high accuracy.

Incidentally, a chromium-containing material film is formed by sputtering, and a chromium target used at the time of film formation is desired to be highly pure. The reason for this is, for example, that it is empirically known that the etching rate of the film generally decreases if any metallic impurity mixes into an inorganic material film.

Note that in connection with tin, JP 8-292549 A mentions ITO (indium tin oxide), along with alumina and tin oxide, as a material hard to be etched even in dry etching using a fluorine gas, describing that ITO is used as an etching stopper.

The present inventors have repeatedly performed various examinations on a novel procedure for increasing the dry-etching rate of a film made of a chromium-containing material while assuring design flexibility of the film. As a result, the present inventors have found out that, when tin is included in the inorganic material film, an increase in etching rate occurs at the time of carrying out chlorine-containing dry-etching.

As described above, however, the present inventors have found that tin localizes and forms into particles several tens to several hundred nanometers in size, if film formation is performed in an atmosphere containing a fewer amount of reactive gas, such as oxygen or nitrogen, when the chromium-containing material is allowed to contain tin, and that these particles turn into defects.

Accordingly, the amount of tin content needs to be suppressed in order to prevent particle formation due to the localization of tin in an electrically conductive light-shielding layer film-formed in an atmosphere containing a fewer amount of reactive gas, such as oxygen or nitrogen.

Further studies made by the present inventors have revealed that in the electrically conductive light-shielding layer, a preferred amount (concentration) of tin content is 0.1 atomic percent or higher but no higher than 11.5 atomic percent. An inorganic material film containing tin within this concentration range eliminates the problem in which tin localizes and forms into particles, with the result that these particles turn into defects in an optical film. Note that the light-shielding layer contains oxygen captured during film formation by a procedure, such as DC sputtering or RF sputtering. The concentration of the oxygen is preferably no higher than 15 atomic percent, in order to maintain the light-shielding property of the light-shielding layer.

That is, an inorganic material film for a photomask blank according to the present invention film-formed by sputtering and composed of a chromium-containing material includes a light-shielding layer having electrical conductivity, wherein the light-shielding layer contains 0.1 atomic percent or more but no more than 11.5 atomic percent of tin and no more than 15 atomic percent of oxygen. Note that the lower limit of oxygen concentration is, for example, 3 atomic percent.

If the amount of tin is smaller than 0.1 atomic percent, the etching rate of the light-shielding layer cannot be sufficiently improved even if the layer contains tin. Alternatively, allowing the light-shielding layer to contain approximately 0.1 atomic percent of tin and approximately 3 atomic percent of oxygen makes it possible to prevent particle formation due to the localization of tin.

The upper limit of the amount of tin is 11.5 atomic percent. If tin is mixed into the light-shielding layer in excess of this limit, the oxygen concentration needs to be increased to higher than 15 atomic percent, in order to prevent particle formation due to the localization of tin. If this is the case, the transmittance of the light-shielding layer at an exposure wavelength becomes higher. As a result, the functionality of the light-shielding layer degrades, and therefore, the film thickness of the light-shielding layer is increased. This is undesirable since it is no longer possible to draw a fine pattern shape on a photomask, and the etching time of the light-shielding layer becomes longer.

Such an inorganic material film as described above has electrical conductivity, and the resistance value of the inorganic material film measures no higher than 5000 $\Omega/cm^2$. This is desirable since the film has an antistatic effect on substrates at the time of electron beam lithography.

As described above, the inorganic material film becomes electrically conductive by properly containing tin and oxygen and prevents particle formation due to the localization of tin. It is therefore possible to prevent defects from arising in the inorganic material film.

Tin in the above-described light-shielding layer may have a profile in which the concentration of the tin varies in the thickness direction (depth direction) of the layer. That is, the abovementioned tin concentration (0.1 atomic percent or higher but no higher than 11.5 atomic percent) is an average value in the light-shielding layer.

In addition, the above-described inorganic material film may include layers other than the light-shielding layer. For example, the inorganic material film may include an anti-reflection layer film-formed by sputtering and composed of a chromium-containing material. That is, the inorganic material film may have a stacked structure composed of the light-shielding layer and the anti-reflection layer. Yet additionally, such an anti-reflection layer may be allowed to contain tin. A preferred amount of tin content at that time is also within the abovementioned range (0.1 atomic percent or higher but no higher than 11.5 atomic percent).

When carrying out sputtering film formation of the inorganic material film of the present invention, a chromium target added with tin (tin-added chromium target) may be used. The chromium target and the tin target may be independently provided to carry out co-sputtering (simultaneous sputtering). Alternatively, a complex target having a chromium region and a tin region in a single target may be used. Furthermore, co-sputtering may be performed using both the above complex target and the chromium target.

In the case of adding tin to the chromium target, it may be added as a metal tin or may be added as a tin compound such as tin oxide, tin nitride, or ITO.

In the case of carrying out co-sputtering using both a tin-containing target and a tin-free target, the concentration of tin in an inorganic film can be adjusted no only by controlling the surface area ratios of the respective targets but also by controlling electric power to be applied to each target.

The sputtering gas used in film formation of the inorganic film of the present invention is suitably selected according to the composition of the film. For example, only argon gas may be used when the film-formation of a tin-containing inorganic film that does not contain a light element is performed. In the case of film-formation of an inorganic film containing a light element, reactive sputtering may be performed in one or more kinds of reactive gas, such as nitrogen gas, nitrogen oxide gas, oxygen gas, carbon oxide gas, hydrocarbon gas, or mixture gas of any of those reactive gas and inert gas such as argon (see, for example, JP 7-140635 A).

The flow rate of sputtering gas is adjusted suitably. The flow rate may be made constant in the process of film-formation. Alternatively, the gas flow rate may be changed according to the target composition when there is a need of changing the amount of oxygen or the amount of nitrogen in a thickness direction.

The chromium-containing material film has been conventionally used as, for example, a light-shielding film constituting a photomask blank (WO 2007/74806 A and JP 2007-33470 A), a hard mask film (JP 2007-241060 A), or an etching stopper film (JP 2007-241065 A).

The inorganic material film according to the present invention, if used as such a light-shielding film, a hard mask film, or an etching stopper film as described above, can have characteristics equivalent to those of a conventional chromium-containing material film and enables a dry-etching rate to be increased. Consequently, the patterning accuracy of the inorganic film can be improved without having to make any design changes to the chromium-containing material film. In addition, defects due to tin particles can be reduced by controlling the amount of tin content in the electrically conductive light-shielding layer.

The inorganic material film of the present invention is specifically composed of a chromium compound, such as tin-containing chromium oxide, tin-containing chromium nitride, tin-containing chromium carbide, tin-containing chromium oxide nitride, tin-containing chromium oxide carbide, or tin-containing chromium oxide nitride carbide, in addition to tin-containing chromium. Among these chromium compounds, tin-containing chromium nitride, tin-containing chromium oxide nitride, and tin-containing chromium oxide nitride carbide are particularly preferred.

As a preferred constituent compound in a case where the inorganic material film of the present invention is used as a hard mask film for the microfabrication of a photomask blank, it is possible to cite, by way of example, a chromium compound containing tin-containing chromium and one or more light elements selected from the group consisting of oxygen, nitrogen and carbon, in addition to tin-containing chromium.

Examples of such a chromium compound may include tin-containing chromium oxide, tin-containing chromium nitride, tin-containing chromium oxide nitride, tin-containing chromium oxide carbide, tin-containing chromium nitride carbide, and tin-containing chromium oxide nitride carbide.

If the above-described inorganic material film is used as a hard mask film formed on a photomask blank for the manufacture of a photomask used to form a resist pattern 50 nm or smaller in size, the thickness of the film is preferably 1 to 20 nm, particularly preferably 1 to 10 nm.

If the inorganic film of the present invention is used as the etching stopper film of a photomask blank, it is possible to select a material the same as the material of the abovementioned hard mask film.

If the thickness of the etching stopper film made from such a material is set to 1 to 30 nm, an excellent etching masking effect can be obtained in the processing of an etching mask film without causing the problem of density dependence. It is therefore possible to increase the etching accuracy of films located below the etching mask film and the etching accuracy of a transparent substrate. Setting the thickness of the etching stopper film to 2 to 20 nm makes it possible to obtain even more excellent etching masking effect.

Like a conventional chromium-containing material film not containing tin, the inorganic film of the present invention can be dry-etched using an oxygen-containing chlorine-containing gas. Under the same conditions, the inorganic film exhibits a dominantly high etching rate, compared with the conventional chromium-containing material film. Dry-etching can be performed, for example, using gas of chlorine gas and oxygen gas at a mixture ratio ($Cl_2$ gas: $O_2$ gas) of 1:2 to 20:1 in terms of volumetric flow rate, and optionally mixed with inert gas such as helium.

EXAMPLES

In the examples cited herein, four types of stacked films (samples A to D) composed of CrN and CrON films different in tin concentration were formed on rectangular (square) quartz substrates, 152 mm on a side and 6 mm in thickness, by a DC sputtering procedure based on co-sputtering using separately-arranged chromium and tin targets. Note that a plurality of samples were fabricated for each of the abovementioned four types of inorganic material film samples (samples A to D).

Table 1 shows the compositions of the light-shielding layers of the abovementioned samples A to D, where the unit of values is "atomic percent." Note that the thickness-wise distributions of tin in films were also measured by ESCA (JPS-9000MC made by JEOL).

TABLE 1

| Sample | Cr | O | Sn | N |
| --- | --- | --- | --- | --- |
| A: Example 1 | 47.2 | 10.1 | 10.9 | 30.2 |
| B: Comparative Example 2 | 43.2 | 9.1 | 12.2 | 33.5 |
| C: Comparative Example 3 | 41.2 | 10.0 | 12.1 | 34.7 |
| D: Comparative Example 4 | 40.0 | 11.4 | 12.2 | 34.6 |

Also note that the amounts of tin content in CrN and CrON films were adjusted by adjusting electrical power applied to chromium and tin targets. As sputtering gases, a gas mixture of argon and nitrogen was used for CrN films and a gas mixture of argon, oxygen and nitrogen for CrON films.

In addition, films composed only of a light-shielding layer not containing tin (sample E) were also formed for comparison. A plurality of samples were also fabricated for the sample E. Surfaces of these samples A to E were observed using an AFM (atomic force microscope) to verify whether or not particles were generated.

Figure 1:
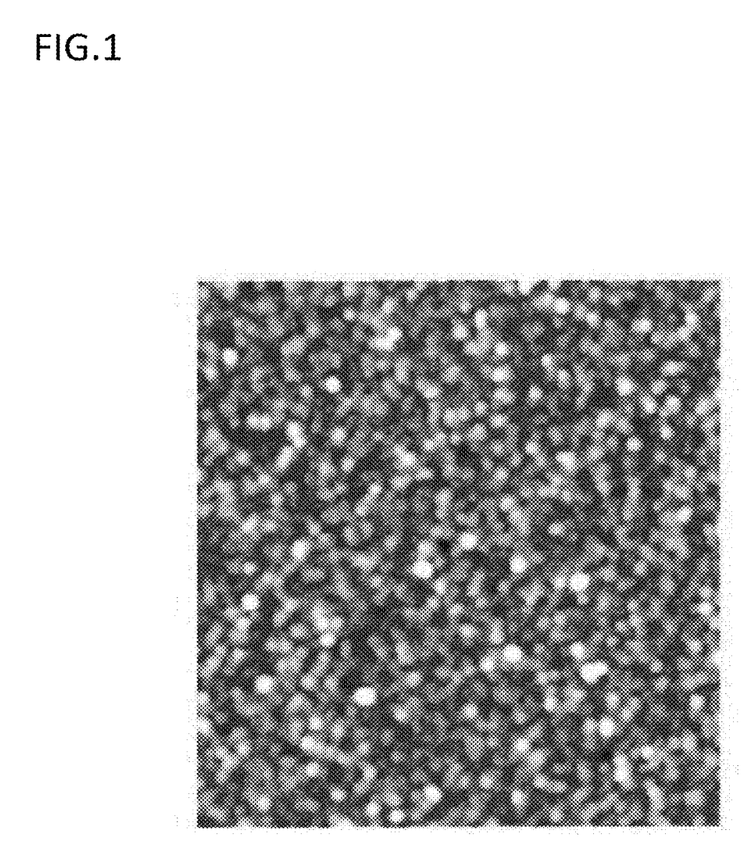
FIG. 1 is an AFM image of a sample A (tin-containing CrN and CrON films)
Figure 2:
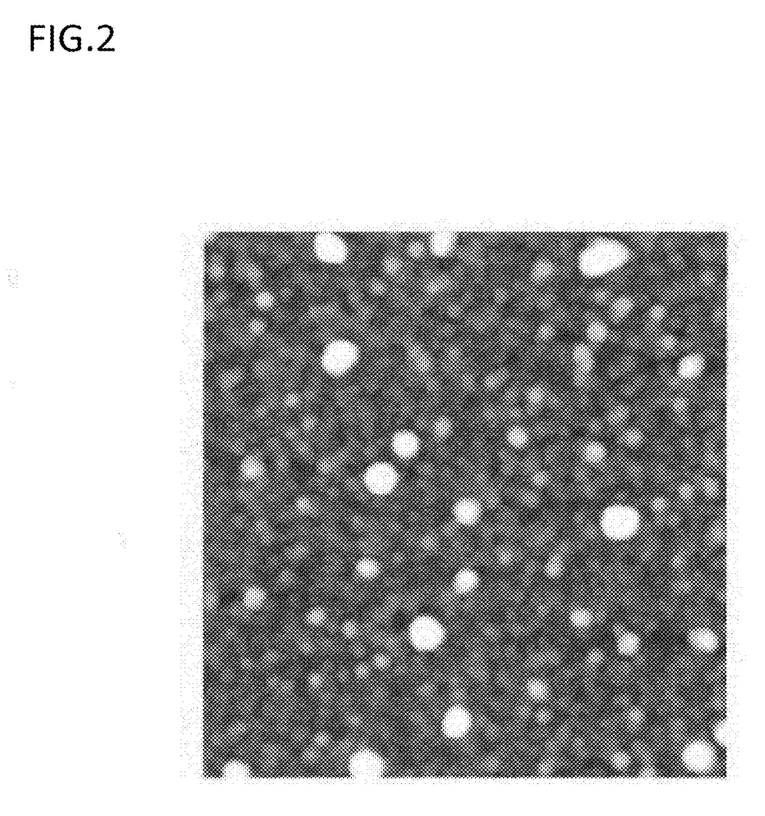
FIG. 2 is an AFM image of a sample B (tin-containing CrN and CrON films)
Figure 3:
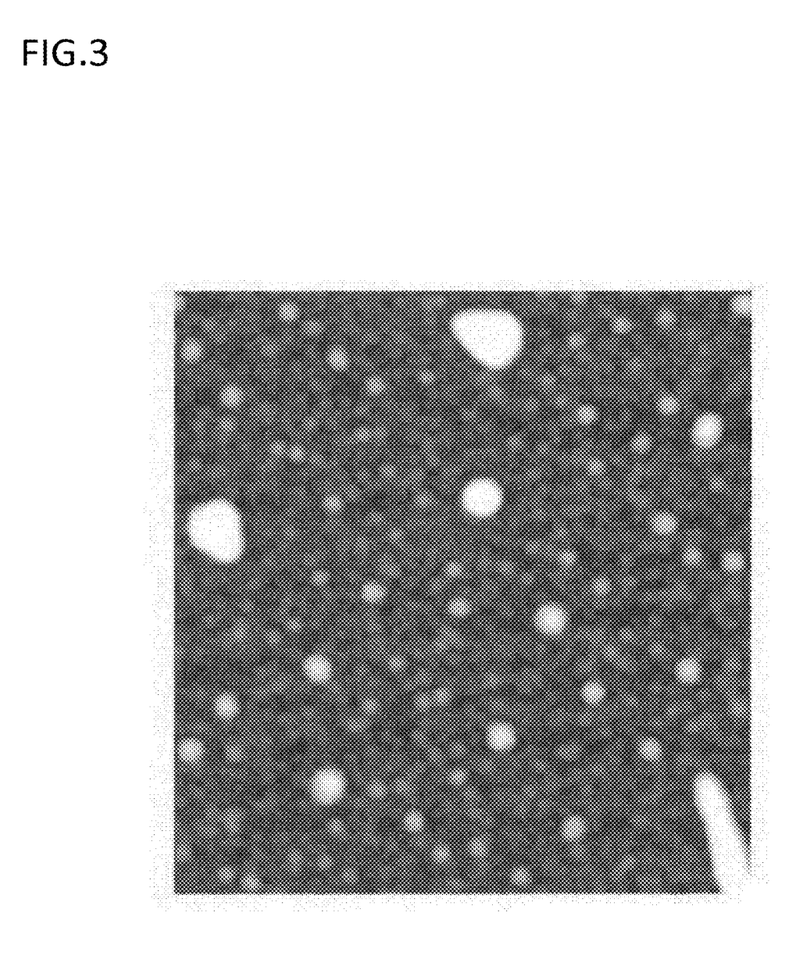
FIG. 3 is an AFM image of a sample C (tin-containing CrN and CrON films)
Figure 4:
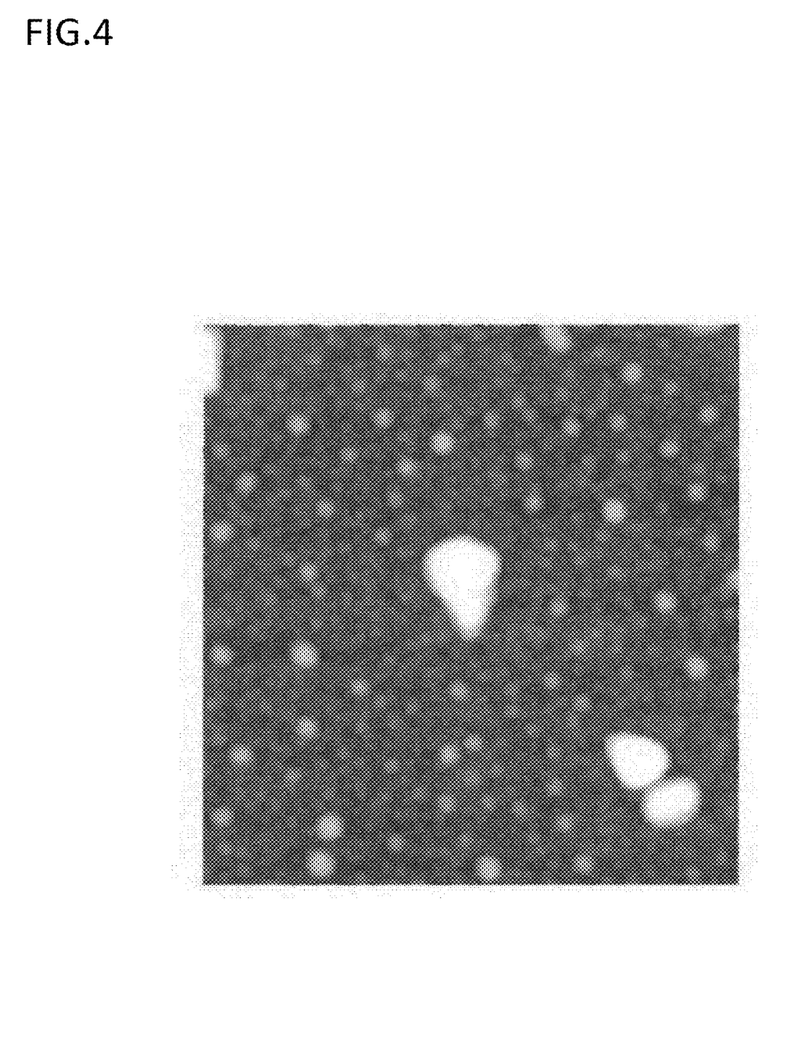
FIG. 4 is an AFM image of a sample D (tin-containing CrN and CrON films)
Figure 5:
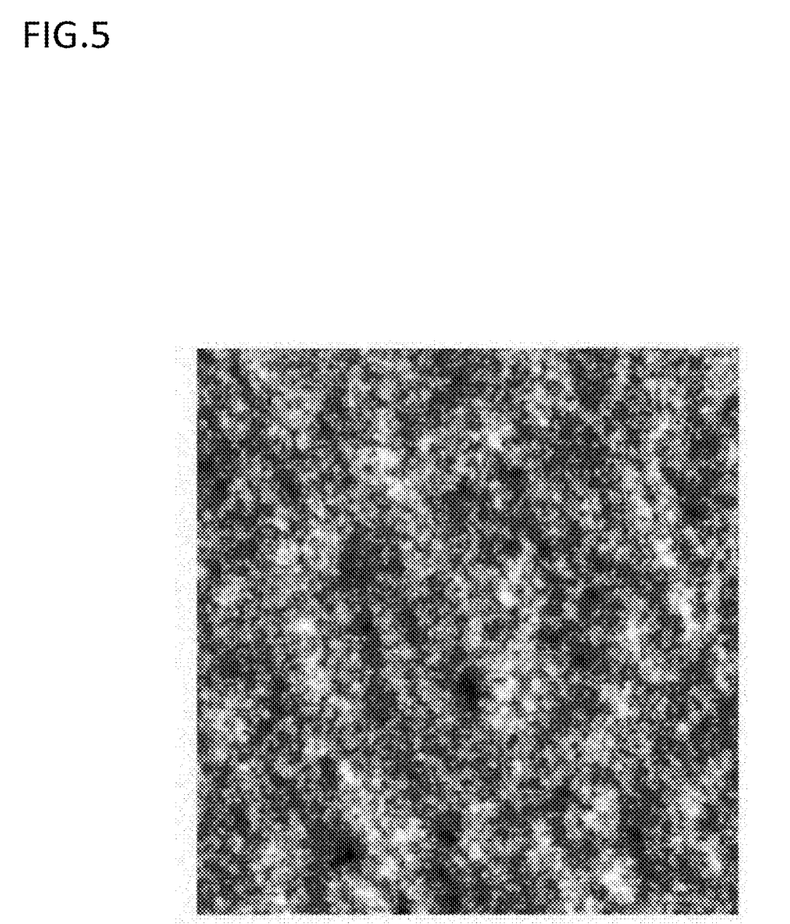
FIG. 5 is an AFM image of a sample E (a film composed only of a light-shielding layer not containing tin).

FIGS. 1 to 5 are the results of surface analysis of respective samples using the AFM.

From these figures, it is possible to confirm that tin particles are not localized on a surface in the sample A, among the stacked films composed of CrN and CrON films, whereas the localization of tin particles on a surface can be confirmed in the samples B to D.

The present inventors repeated the same test many times and statistically processed data. As a result, the present inventors confirmed that tin particles were not localized on a surface in a film in which the amount of tin content in a light-shielding layer was no higher than 11.5 atomic percent and the amount of oxygen content in the light-shielding layer was no higher than 15 atomic percent, whereas tin particles were localized on a surface in a film in which the amount of tin content in the light-shielding layer was higher than 11.5 atomic percent. Note that in order to obtain the effect of tin addition, the amount of tin content has to be no smaller than 0.1 atomic percent. That is, the light-shielding layer has to be a film whose amount of tin content is 0.1 atomic percent or higher but no higher than 11.5 atomic percent, and the amount of oxygen content is no higher than 15 atomic percent.

Subsequently, the present inventors evaluated the surface roughness of these samples A to E.

Table 2 shows the surface roughness values of respective samples.

TABLE 2

| Sample | Surface roughness (Ra) |
| --- | --- |
| A: Example 1 | 0.69 nm |
| B: Comparative Example 2 | 1.44 nm |

TABLE 2-continued

| Sample | Surface roughness (Ra) |
| --- | --- |
| C: Comparative Example 3 | 1.90 nm |
| D: Comparative Example 4 | 2.90 nm |
| E: Light-shielding film not containing tin | 0.85 nm |

A film (sample A) whose amount of tin content is no higher than 11.5 atomic percent and whose amount of oxygen content is no higher than 15 atomic percent has an arithmetic average roughness (Ra) of no higher than 1.0 nm, which is equal to or lower than the surface roughness of an inorganic material film composed only of a chromium-containing material (sample E). On the other hand, surface roughness exceeds 1.0 nm in terms of arithmetic average roughness (Ra) in all of the comparative examples (samples B to D), where the values of surface roughness tend to become larger as the amount of tin content increases. This is considered to be due to the localization of tin particles.

As described above, in the present invention, the amount of tin content is set to a proper range in an inorganic material film including a light-shielding layer having electrical conductivity, so that tin does not localize in the light-shielding layer. Consequently, when the inorganic material film according to the present invention is used as a light-shielding film, a hard mask film, an etching stopper film, or the like, it is possible to improve a dry-etching rate, while concurrently securing characteristics equivalent to those of a conventional chromium-containing material film. It is also possible to prevent defect generation due to the localization of tin.

Such an inorganic material film as described above has favorable characteristics as one of a light-shielding film, a hard mask film, and an etching stopper film to be arranged in a photomask blank.

In addition, use of such a photomask blank makes it possible to secure not only the improvement of the etching rate but also the predetermined optical characteristics of the photomask blank. A photomask having a fine pattern can therefore be manufactured by patterning the inorganic material film by chlorine-containing dry etching.

INDUSTRIAL APPLICABILITY

According to the present invention, it is possible to improve a dry-etching rate, while concurrently securing characteristics equivalent to those of a conventional chromium-containing material film. It is also possible to prevent defect generation due to the localization of tin.

What is claimed is:

1. An inorganic material film comprising:
a chromium-containing material, and
a light-shielding layer having electrical conductivity,
wherein:
the light-shielding layer comprises 0.1 atomic percent to 11.5 atomic percent of tin and 15 atomic percent or less of oxygen; and
the inorganic material film has an arithmetic average roughness (Ra) of 1.0 nm or less.

2. The inorganic material film according to claim 1, further comprising an anti-reflection layer film formed by sputtering and comprising a chromium-containing material.

3. The inorganic material film according to claim 2, wherein the anti-reflection layer comprises tin.

4. The inorganic material film according to claim 2, having a stacked structure comprising the light-shielding layer and the anti-reflection layer.

5. The inorganic material film according to claim 1, having a resistance value of 5000 $\Omega/cm^2$ or smaller.

6. The inorganic material film according to claim 1, wherein an oxygen concentration in the light-shielding layer is 3 atomic percent or higher.

7. The inorganic material film according to claim 1, wherein the chromium-containing material is selected from the group consisting of chromium metal, chromium oxide, chromium nitride, chromium carbide, chromium oxide nitride, chromium oxide carbide, and chromium oxide nitride carbide.

8. A photomask blank comprising the inorganic material film according to claim 1 as a light-shielding film, a hard mask film, or an etching stopper film.

9. A method for manufacturing a photomask, comprising patterning the inorganic material film by chlorine-containing dry etching using the photomask blank according to claim 8.

* * * * *